United States Patent

Aronowitz et al.

[11] Patent Number: 5,192,712
[45] Date of Patent: Mar. 9, 1993

[54] CONTROL AND MODERATION OF ALUMINUM IN SILICON USING GERMANIUM AND GERMANIUM WITH BORON

[75] Inventors: Sheldon Aronowitz; Amolak Ramde, both of San Jose, Calif.

[73] Assignee: National Semiconductor Corporation, Santa Clara, Calif.

[21] Appl. No.: 868,808

[22] Filed: Apr. 15, 1992

[51] Int. Cl.⁵ .......................................... H01L 21/266
[52] U.S. Cl. ..................................... 437/143; 437/30; 437/150; 437/959
[58] Field of Search ......................... 437/24, 26, 27, 28, 437/29, 30, 141, 143, 149, 150, 933, 934, 959; 148/DIG. 33, DIG. 34, DIG. 40, DIG. 58; 357/63

[56] References Cited

U.S. PATENT DOCUMENTS

| | | | |
|---|---|---|---|
| 3,725,145 | 4/1973 | Maki | 437/959 |
| 4,290,830 | 9/1981 | Mochizuki | 437/143 |
| 4,295,898 | 10/1981 | Yoshida et al. | 437/933 |
| 4,746,964 | 5/1988 | Aronowitz | 357/63 |
| 4,804,634 | 2/1989 | Krishna et al. | 437/150 |
| 4,908,328 | 3/1990 | Hu et al. | 437/63 |
| 4,940,671 | 7/1990 | Small et al. | 437/26 |
| 4,962,051 | 10/1990 | Liaw | 437/959 |
| 5,095,358 | 3/1992 | Aronowitz et al. | 357/63 |

Primary Examiner—Brian E. Hearn
Assistant Examiner—C. Chaudhari
Attorney, Agent, or Firm—Gail W. Woodward; Irving S. Rappaport; James W. Rose

[57] ABSTRACT

A process is disclosed for controlling the diffusion of aluminum in silicon for the fabrication of monolithic pn junction isolated integrated circuits. Germanium is incorporated into the silicon where isolation or p-well diffusion of aluminum is to occur. Aluminum diffusion is modified by the presence of the germanium so that channeling and out diffusion are controlled. The control is enhanced when boron is incorporated into the silicon along with the aluminum.

6 Claims, 1 Drawing Sheet

CONTROL AND MODERATION OF ALUMINUM IN SILICON USING GERMANIUM AND GERMANIUM WITH BORON

BACKGROUND OF THE INVENTION

Aluminum is used in integrated circuit (IC) processes for isolation purposes and for forming p-wells. The feature that makes aluminum attractive for use in p-well formation or isolation is that it is a very fast diffuser in silicon. The aluminum is typically deposited by ion implantation in which the aluminum ions are accelerated at high voltage and caused to impinge the silicon surface where they penetrate a short distance into the crystal lattice. This is followed by a high temperature diffusion in which the aluminum atoms diffuse further into the silicon body.

In the case of aluminum, the implanted atoms can pass through a silicon crystal with relative ease as an interstitial species. This is known as channeling which produces a relatively great penetration that can be employed to advantage and which, when uncontrolled, can cause a great deal of trouble. Apparently, the silicon crystal lattice is relatively transparent to the energetic aluminum atoms. Channeling can be particularly detrimental when aluminum is being used for isolation or p-well formation. It is desirable to enhance the effective diffusivity of aluminum anisotropically, reduce its channeling and increase the extent to which a population of aluminum becomes electrically active. We have discovered that both theory and experiment yield that a single group III species will exhibit retarded diffusion in the presence of very high concentrations of germanium, when that species is interstitial, but it will display enhanced diffusion when substitutional. Combinations of group III dopants are known to interact with each other. (See U.S. Pat. No. 4,746,964.) That interaction can be used to exercise considerable control over the diffusion behavior of the p-type dopants when germanium is present in very high concentrations. This is disclosed in our patent application Ser. No. 710,646, now U.S. Pat. No. 5,137,838, which was filed June 5, 1991, and titled METHOD OF FABRICATING P-BURIED LAYERS FOR PNP DEVICES. The teachings in the above noted patent and patent application are incorporated herein by reference.

SUMMARY OF THE INVENTION

It is an object of the invention to incorporate a high concentration of germanium into a silicon substrate that is to be doped with aluminum wherein channeling is avoided.

It is a further object of the invention to incorporate a high concentration of germanium into a silicon substrate that is to be provided with an aluminum doped p-well.

It is a still further object of the invention to incorporate a high concentration of germanium into an n-type epitaxial layer to be employed in a silicon monolithic integrated circuit wherein aluminum is employed for isolation.

It is a still further object of the invention to employ a combination of aluminum and boron to produce a p-well or an isolation region in an n-type silicon body which contains a high concentration of germanium.

These and other objects are achieved as follows. An n-type silicon body is provided with a high concentration of germanium. The germanium is applied to the silicon in the range of about 10 to 50 atomic % in the form of an n-type epitaxial layer in which the silicon and germanium are codeposited or in an n-type silicon body which has been ion implanted with germanium and anneal to minimize crystalline structure damage. The silicon-germanium layer is ion implanted with aluminum and boron which are implanted where an isolation region is to be created. The germanium in the silicon greatly reduces any tendency for aluminum channeling. In the subsequent diffusion operation the combination of boron and aluminum reduces diffusion of interstitial aluminum. However, where the aluminum extends into the silicon body beyond the boron, the aluminum doping is substitutional and the diffusion rate is enhanced. This set of characteristics means that the aluminum will rapidly diffuse vertically into the silicon and the isolation diffusion will completely penetrate the epitaxial layer to achieve isolation. However, at the silicon surface, where diffusion is retarded, the aluminum will display reduced lateral diffusion. Furthermore, it will not tend to outdiffuse where it is taken up by the oxide. This means that the aluminum surface depletion is reduced.

In the p-well production using aluminum it is preferred that the germanium be applied to the entirety of the epitaxial layer. This is done by simultaneously depositing silicon and germanium in the vapor-phase growing of the epitaxial layer. The layer composition, in terms of the germanium content, is determined by the percentage of vapor phase germanium compound and the deposition conditions. It is relatively easy to keep the germanium content of the silicon in the 10 to 50 atomic % range.

From the above, it can be seen that the presence of germanium and boron in the silicon renders the aluminum diffusion anisotropic. Its diffusion will be greatly retarded at the surface near which the boron is present and enhanced in the silicon that is free of the boron. This means that lateral diffusion and surface depletion of the aluminum are minimized. Yet, the aluminum can rapidly produce a deep p-well or isolation region.

Figure 1:
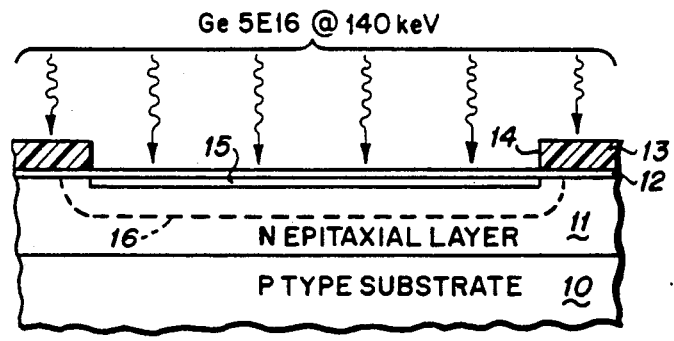
FIGS. 1 through 4 illustrate a fragment of a silicon IC wafer in various stages of the isolation process.

The drawing is not to scale. The vertical dimensions have been exaggerated to better show the details of the invention. For example, in the preferred embodiments the substrate wafer can be well over 1500 microns thick while the epitaxial layers are typically on the order of 10 microns thick. Also, the drawings employ the conventional or ion implantation notation which is shown for dose definition. For example, B1E14 means $1 \times 10^{14}$ boron atoms per $cm^2$.

DESCRIPTION OF THE INVENTION

Starting with FIG. 1, the isolation process of the invention will be detailed. A p-type substrate wafer 10 has an n-type layer 11 grown on top as is conventional in the well known silicon planar epitaxial pn junction isolated monolithic integrated circuit fabrication process. A thin protective oxide layer 12, about 20Å thick, is grown over the wafer surface. A photoresist mask 13 is applied to the wafer and is processed to produce an opening 14 therein. Then, a heavy dose of germanium is ion implanted. The preferred dose is $5 \times 10^{16}$ atoms of germanium per cm$^2$ at a potential of about 190 keV. This creates a germanium implant layer 15 which extends for a short distance into the silicon surface. At the implant conditions oxide layer 12 will be substantially transparent.

Resist 13 is then stripped away and the wafer annealed at about 1000° C. for about 30 minutes in a non-oxidizing ambient. This anneal acts to heal the implant damaged silicon crystal structure and also inserts the germanium atoms into substitutional crystal lattice sites. This anneal also results in the germanium diffusing into the silicon to create a germanium-silicon region 16, as shown in FIG. 2, and which is shown in dashed outline in FIG. 1.

In the preferred embodiment the germanium content in the silicon at the wafer surface is in the range of 10 to 50 atomic %. When the content is kept below 50 atomic % the wafer, when oxidized, will be covered by SiO$_2$. When the 50 limit is exceeded the oxide can be a complex mixture of silica and germania. Such mixtures are undesirable in the planar IC processing. When the germanium content is below about 10 atomic %, its beneficial effect is substantially reduced.

Figure 2:
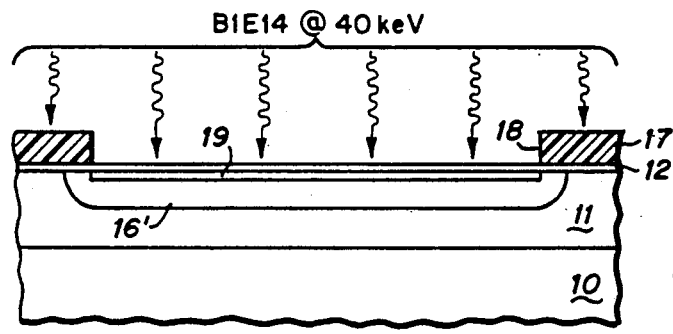
Figure 3:
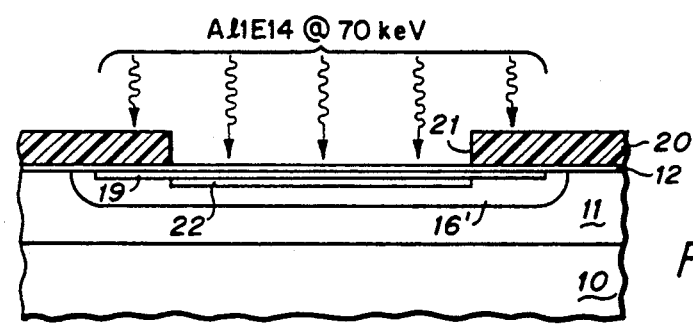
Figure 4:
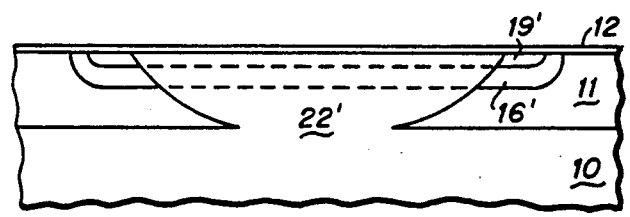

As shown in FIG. 2, a second photoresist layer 17 is applied to the wafer and an opening 18 photolithographically created. Then boron is ion implanted as shown. The boron implant dose is $10^{14}$ atoms per cm$^2$ at an energy of about 40 keV in the preferred embodiment. This produces a boron rich region 19 in the silicon surface. The photoresist is stripped away and a new photoresist layer 20 applied as shown in FIG. 3. An opening 21 is photolithographically created to be slightly smaller than opening 18 in FIG. 2. This reduces the area of surface exposure and obscures the edges of region 19. Then, as shown in FIG. 3, aluminum is ion implanted at an energy of about 70 keV to a dose of about $10^{14}$ atoms per cm$^2$. Thus, aluminum implanted region 22 lies inside boron implanted region 14 and, due to the higher energy, extends further into the silicon. However, both regions 19 and 22 are confined to inside region 16, as shown.

Then, a conventional high temperature isolation diffusion is operated. The time and temperature are selected so that the aluminum in region 22' completely penetrates epitaxial layer 11 to contact substrate 10.

During this diffusion the boron atoms diffuse to a lesser degree to produce region 19'. Thus, the surface portion of region 22' is provided with a boron rich layer which will interact with the aluminum to control the impurity action. As pointed out above, the presence of both boron and germanium will prevent aluminum channeling so that lateral diffusion of the aluminum is minimized. Furthermore, the boron/germanium rich layer will minimize outdiffusion of the aluminum thereby avoiding the commonly encountered surface depletion of the aluminum. Finally, since the aluminum penetrating into the silicon bulk outruns both the boron and germanium, it will rapidly diffuse down to the substrate wafer to rapidly produce the desired isolation. In effect, the presence of the boron-germanium combination produce anisotropic aluminum diffusion to independently control both the surface and bulk aluminum diffusion.

Figure 5:
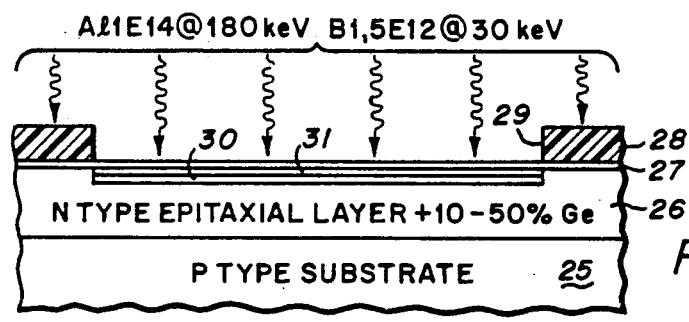
FIGS. 5 and 6 illustrate a fragment of a silicon IC wafer in various stages of the p-well process.
Figure 6:
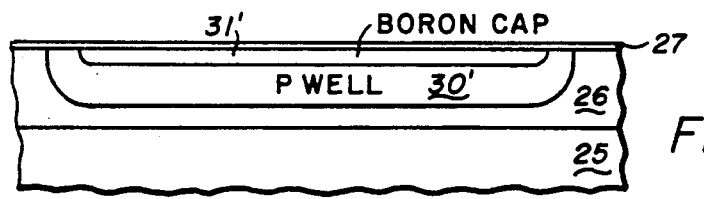

The invention can be applied to the creation of a p well in an N type silicon structure as shown in FIGS. 5 and 6. While the process is shown as applied to an epitaxial layer created upon a p-type substrate wafer it can be applied to other structures. For example, it could be applied to an N+ wafer to be employed in CMOS device fabrication. Also, it could be applied to the N type well created in a p-type silicon region to be employed in fabricating complementary transistors simultaneously, as taught in the above-identified U.S. Pat. Nos. 4,940,671 and 4,908,328.

As shown in FIG. 5, a p-type substrate wafer 25 is provided with an n-type epitaxial layer 26. The epitaxial deposition process is modified to include germanium. The conditions of deposition are controlled so that the germanium content of layer 26 exceeds about 10 atomic % so that the effects of diffusion control are realized. The maximum germanium content of 50 atomic % is present so that any grown oxides will contain only silicon thereby enhancing the planar processing. Protective oxide layer 27, which is about 20Å thick, is provided by means of thermal oxidation.

Photoresist 28 is applied over the wafer and opening 29 photolithographically produced. This opening is slightly smaller than the P well to be created. As shown in FIG. 5, aluminum is ion implanted at an energy of about 180 keV and a dose of about $10^{14}$ atoms per cm$^2$. Boron is also implanted through the same opening at an energy of about 30 keV and a dose of about $1.5 \times 10^{12}$ atoms per cm$^2$. Thus, aluminum implanted region 30 extends to a greater depth and is more heavily doped than boron region 31. Both regions 30 and 31 have the same lateral extent.

The resist is then stripped away and the wafer subjected to a P well diffusion which produces the structure of FIG. 6. The aluminum diffuses to create P type region 30' which defines the P well and the boron diffuses to a lesser degree to produce a cap region 31'. Aluminum vertical channeling is minimized by the germanium so that P well depth is controlled. The boron and germanium in region 31' prevent outdiffusion of the aluminum thereby avoiding surface aluminum depletion. Also, lateral aluminum channeling is avoided, thus, the undesirable channeling results are mitigated.

The invention has been described and preferred embodiments detailed. When a person skilled in the art reads the foregoing description, alternatives and equivalents, within the spirit and intent of the invention, will be apparent. Accordingly, it is intended that the scope of the invention be limited only by the claims that follow.

We claim:

1. A process for controlling the diffusion of aluminum in silicon to form PN junction isolation regions in a monolithic integrated circuit silicon wafer comprising the steps of:

incorporating germanium into said silicon wafer in those regions where an isolation diffusion is desired by ion implantation prior to the incorporation of aluminum to produce a germanium concentration of about 10 atoms % to about 50 atomic % annealing said silicon, with said germanium therein, to drive said germanium to take up substitutional atomic sites in the crystal lattice of said silicon;

applying aluminum to said silicon after said annealing in said regions where an isolation diffusion is desired; and diffusing said aluminum whereby said diffusion is retarded where said germanium is present and, therefore, said diffusion is relatively enhanced after said aluminum has diffused completely through said germanium containing silicon.

2. The process of claim 1 further including the incorporation of boron into said silicon along with said aluminum.

3. A process for incorporating germanium into aluminum doped silicon in the fabrication of monolithic PN junction isolated integrated circuits for controlling the diffusion of said aluminum in a silicon substrate, comprising the steps of:

- ion implanting germanium in said silicon substrate where said aluminum is to be applied in a subsequent step, said germanium being present in the form of a subsurface layer having a concentration of about 10 atomic % to about 50 atomic %;
- annealing said substrate to cause said germanium to be driven to substitutional crystal lattice sites in said silicon substrate;
- forming an ion implantation mask on said silicon substrate having openings where said aluminum is to be incorporated into said silicon substrate;
- ion implanting aluminum into the surface of said silicon substrate exposed inside said openings; and
- diffusing said aluminum into said silicon substrate wherein the diffusion is retarded by said germanium subsurface layer and, therefore, relatively enhanced after said subsurface layer has been spanned by said aluminum.

4. The process of claim 3 further including the step: ion implanting boron into said silicon substrate along with said aluminum.

5. A process for incorporating germanium into aluminum doped silicon in the formation of a P well used in monolithic planar epitaxial PN junction isolated integrated circuits for controlling the diffusion of said aluminum in a silicon substrate, comprising the steps of:

- growing an epitaxial layer onto a silicon wafer by codepositing epitaxial silicon and germanium wherein the germanium content is about 10 atomic % to about 50 atomic;
- forming an ion implantation mask on said epitaxial layer having openings where P wells are to be produced;
- ion implanting aluminum into said epitaxial layer where exposed inside said openings in said mask;
- diffusing said aluminum into said epitaxial layer to a depth that is required by said P well whereby said diffusion is retarded and controlled by said germanium.

6. The process of claim 5 further including the step of depositing boron along with said aluminum whereby said P well includes a boron cap.

* * * * *